United States Patent
Na

(10) Patent No.: US 8,207,930 B2
(45) Date of Patent: Jun. 26, 2012

(54) DISPLAY DEVICE INCLUDING A TEST PAD CONFIGURATION FOR AN IMPROVED INSPECTION TEST

(75) Inventor: Hyung-Don Na, Seoul (KR)

(73) Assignee: Samsung Electronics Co., Ltd. (KR)

( * ) Notice: Subject to any disclaimer, the term of this patent is extended or adjusted under 35 U.S.C. 154(b) by 1059 days.

(21) Appl. No.: 11/974,127

(22) Filed: Oct. 10, 2007

(65) Prior Publication Data
US 2008/0179592 A1    Jul. 31, 2008

(30) Foreign Application Priority Data
Jan. 25, 2007   (KR) .................. 10-2007-0007837

(51) Int. Cl.
*G09G 3/36*     (2006.01)
*G01R 31/26*    (2006.01)

(52) U.S. Cl. .................... 345/100; 324/760.01

(58) Field of Classification Search ............ 345/87–100; 324/770, 760.01
See application file for complete search history.

(56) References Cited

U.S. PATENT DOCUMENTS

| | | | |
|---|---|---|---|
| 5,657,139 A * | 8/1997 | Hayashi ..................... | 349/40 |
| 5,671,026 A * | 9/1997 | Shiraki et al. .................. | 349/40 |
| 6,437,596 B1 * | 8/2002 | Jenkins et al. ............ | 324/754.03 |
| 7,456,647 B2 * | 11/2008 | Jeon et al. ................ | 324/760.01 |
| 2002/0191140 A1 | 12/2002 | Eguchi et al. | |
| 2004/0119925 A1 | 6/2004 | Moon | |
| 2004/0174183 A1 * | 9/2004 | Nojiri et al. .................... | 324/770 |
| 2004/0207772 A1 * | 10/2004 | Tomita ............................ | 349/42 |
| 2005/0264503 A1 * | 12/2005 | Wu et al. ......................... | 345/87 |
| 2006/0001622 A1 * | 1/2006 | Kim ................................. | 345/76 |
| 2006/0192585 A1 * | 8/2006 | Chen et al. ..................... | 324/770 |
| 2006/0279667 A1 * | 12/2006 | Tsai et al. ........................ | 349/40 |
| 2007/0146002 A1 * | 6/2007 | Hsieh et al. .................... | 324/770 |
| 2007/0205754 A1 * | 9/2007 | Shiau et al. ................. | 324/158.1 |

FOREIGN PATENT DOCUMENTS
JP   2004-317885   11/2004
(Continued)

OTHER PUBLICATIONS

Patent Abstracts of Japan, Publication No. 2004-317885, Nov. 11, 2004, 1 p.

(Continued)

*Primary Examiner* — Chanh Nguyen
*Assistant Examiner* — Sanghyuk Park
(74) *Attorney, Agent, or Firm* — Innovation Counsel LLP

(57) ABSTRACT

The present invention relates to a display device. The display device includes a display panel having gate lines and data lines, a driving chip mounted on the display panel, and a flexible printed circuit film (FPC) attached to the display panel. The display panel includes a plurality of first to third pads, a first switching element, a second switching element, a first test pad, and a second test pad. The plurality of first to third pads are sequentially disposed and electrically connected with each other. The first switching element is interposed between the first pad and the second pad. The second switching element is connected to the third pad. The first test pad is commonly connected to control terminals of the first and second switching elements. The second test pad is connected to an input terminal of the second switching element. According to the present invention, processing time and production yield can be increased by improving the detection performance in a visual inspection test process.

20 Claims, 7 Drawing Sheets

FOREIGN PATENT DOCUMENTS

| | | |
|---|---|---|
| JP | 2005-69945 | 3/2005 |
| JP | 2006-154324 | 6/2006 |
| JP | 2006-235358 | 9/2006 |
| KR | 10-2005-0012520 | 2/2005 |
| KR | 10-2005-0114011 | 12/2005 |
| KR | 10-2006-0000605 | 1/2006 |
| KR | 10-2006-0036655 | 5/2006 |
| KR | 10-2006-0075173 | 7/2006 |

OTHER PUBLICATIONS

Patent Abstracts of Japan, Publication No. 2005-069945, Mar. 17, 2005, 1 p.

Patent Abstracts of Japan, Publication No. 2006-154324, Jun. 15, 2006, 1 p.

Patent Abstracts of Japan, Publication No. 2006-235358, Sep. 7, 2006, 1 p.

Korean Patent Abstracts, Publication No. 1020050012520, Feb. 2, 2005, 1 p.

Korean Patent Abstracts, Publication No. 1020050114011, Dec. 5, 2005, 1 p.

Korean Patent Abstracts, Publication No. 1020060000605, Jan. 6, 2006, 1 p.

Korean Patent Abstracts, Publication No. 1020060036655, May 2, 2006, 1 p.

Korean Patent Abstracts, Publication No. 1020060075173, Jul. 4, 2006, 1 p.

* cited by examiner

DISPLAY DEVICE INCLUDING A TEST PAD CONFIGURATION FOR AN IMPROVED INSPECTION TEST

CROSS-REFERENCE TO RELATED APPLICATION

This application claims the benefit of priority of Korean Patent Application No. 10-2007-0007837 filed in the Korean Intellectual Property Office on Jan. 25, 2007, the entire contents of which are incorporated herein by reference.

BACKGROUND OF THE INVENTION (a) Field of the Invention

The present invention relates to a display device.

(b) Description of the Related Art

Recently, flat panel displays such as an organic light emitting display device (OLED), a plasma display device (PDP), or a liquid crystal display (LCD), each of which can be substituted for heavy and large cathode ray tube (CRT) displays, have been actively developed.

The PDP is a device for displaying characters and images by using light emitted by a plasma generated in a gas by an electric discharge, and the OLED is a device for displaying characters and images by using light generated by field emission of particular organic materials or polymers. The LCD is a device for displaying characters and images by using light transmitted through a liquid crystal layer interposed between two panels. The transmittance of light that passes through the liquid crystal layer and a polarizer is controlled by an electrical field applied across the liquid crystal layer.

Flat panel displays, the LCD and the OLED, for example, include a display panel on which a matrix of pixels is provided, each pixel having an associated switching element. Display signal lines, including gate lines and data lines are provided on the display panel. A gate driver is provided for transmitting gate signals on the gate lines to the control terminals of the pixel switching elements. A gray voltage generator is provided for generating a plurality of gray voltages, and a data driver is provided for selecting data voltages, corresponding to video data, from among the gray voltages and transmitting the selected data voltages on the data lines to the input terminals of the pixel switching elements. A signal controller is provided for controlling the gray voltage generator, the gate driver and the data driver.

A small display device, for example, a display device for a cellular phone, includes a display panel, a flexible printed circuit film FPC having wiring for transmitting an external signal, and an integrated circuit chip which functions as a driving chip or a control chip for controlling the display panel and the FPC.

The driving chip generates control signals and driving signals for controlling the display panel, and is usually mounted on the display panel in a form known as chip on glass (COG).

When, in the process of manufacturing a display device, the display signal lines become disconnected or short-circuited, or the pixels become defective, the disconnected and short-circuited display signal lines and the defective pixels can be detected via a number tests conducted during or after the manufacturing process. Such tests include an array test, an in process visual inspection test, a gross test, and a module test, the latter being performed after a driving chip is mounted on the display panel. In the visual inspection test, test voltages are applied to display signal lines and the response or lack of response of pixels is observed.

In the case of a small display device that includes a display panel and a printed circuit film FPC, the display panel and the FPC both include signal lines and pads for transmitting signals, and defective signals lines and defective pads are detected at each test process.

However, only some of the pads can be tested in the visual inspection test, and the rest of the pads cannot be tested until the final module test process is performed after mounting a driving chip on the display panel. Accordingly, a defective pad may not be detected until the final module test process is performed, thereby increasing manufacturing time per acceptable display panel and reducing production yield.

SUMMARY OF THE INVENTION

In accordance with the present invention, a display device is provided having a display panel that can be tested during manufacture of the display panel by using a visual inspection test process to detect a range of defects before attachment of a driving chip to the display panel. The range of defects includes defects in pads used for attaching a driving chip to the display panel and in pads used for attaching a flexible printed circuit film to the display panel.

An exemplary display device according to one embodiment of the present invention includes a display panel, a driving chip mounted on the display panel, and a flexible printed circuit film (FPC) attached to the display panel. The display panel includes a plurality of display signal lines including gate lines and data lines, a plurality of first pads, a plurality of second pads, a plurality of third pads, a first test pad, and a second test pad. A first switching element is disposed between one of the first pads and one of the second pads, with the output terminal of the first switching element being connected to the one of the first pads and the input terminal of the first switching element being connected to the one of the second pads, and the one of the second pads being connect to one of the third pads. A second switching element includes an output terminal that is connected to the one of the third pads. The first test pad is connected to the control terminal of the first switching element and to the control terminal of the second switching element. The second test pad is connected to the input terminal of the second switching element. The one of the first pads is located on one of the signal lines.

In a visual inspection test, performed during the manufacture of the display panel and before the driving chip is mounted on the display panel, a voltage is applied to the first test pad to turn "on" the first switching elements and the second switching elements. A test voltage is applied to the second test pad and through the first and second switching elements to the display signal lines.

The display panel includes a display area and a peripheral area outside the display area, and a driving chip area in the peripheral area. The driving chip is attached to the display panel in the driving chip area.

In addition, the FPC may include a plurality of fourth pads that are attached to the third pads on the display panel.

The plurality of display signal lines includes the data lines $D_1$ to $D_m$ and the gate lines $G_1$ to $G_n$.

The first and second pads may be positioned in the driving chip area where the driving chip is mounted.

The second switching element may be connected to the second test pad through a connection line that connects input terminals of each of the second switching elements.

The driving chip includes a gate driver for generating gate signals and applying the gate signals to the gate lines, and a data driver for generating data signals and applying the data signals to the data lines.

The display signal lines may be numbered in a sequence of consecutive odd and even numbers, wherein, for an odd numbered display signal line an odd first test pad is connected to the control terminal of a first switching element and to the control terminal of a second switching element, and an odd number second test pad is connected to the input terminal of the second switching element; and for an even numbered display signal line, an even first test pad is connected to the control terminal of a first switching element and to the control terminal of a second switching element and an even second test pad is attached to an input terminal of the second switching element.

The first switching element may include third and fourth switching elements and the second switching element includes fifth and sixth switching elements, and the third and fifth switching elements may be connected to an odd-numbered pad among the first and third pads and the fourth and sixth switching elements may be connected to an even-numbered pad among the first and third pads.

The first test pad may include third and fourth test pads, control terminals of the third and fifth switching elements may be connected to the third test pad, and control terminals of the fourth and sixth switching elements may be connected to the fourth pad.

Further, the second test pad may include fifth and sixth test pads, an input terminal of the fifth switching element may be connected to the fifth test pad, and an input terminal of the sixth switching element may be connected to the sixth test pad.

BRIEF DESCRIPTION OF THE DRAWINGS

The accompanying drawings briefly described below illustrate exemplary embodiments of the present invention and, together with the description, serve to explain the principles of the present invention.

DETAILED DESCRIPTION OF THE EMBODIMENTS

The present invention will be described more fully hereinafter with reference to the accompanying drawings, in which exemplary embodiments of the invention are shown.

A display panel and a display device including the display panel according to an exemplary embodiment of the present invention will be described in detail. A liquid crystal display will be described as an example of a display device.

Figure 2:
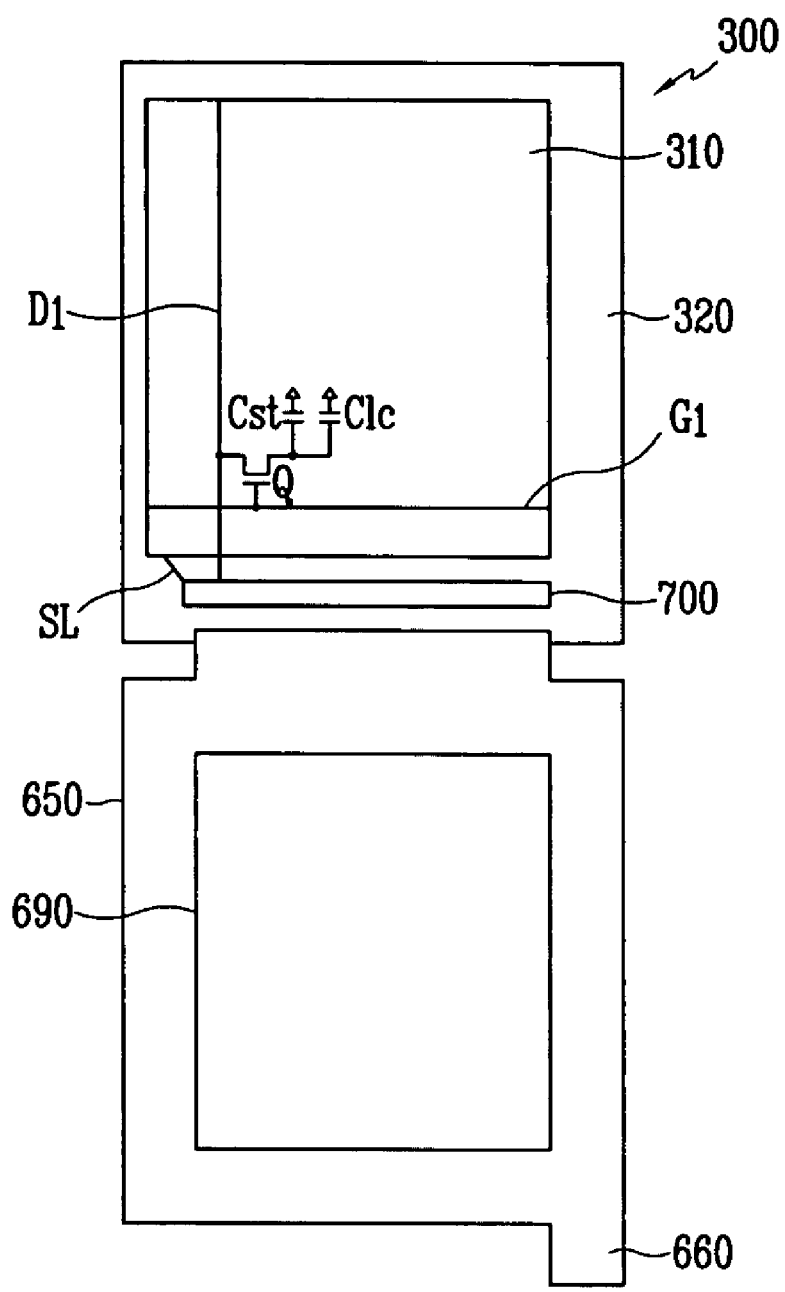
FIG. 2 is a schematic diagram of a liquid crystal display according to an exemplary embodiment of the present invention.
Figure 3:
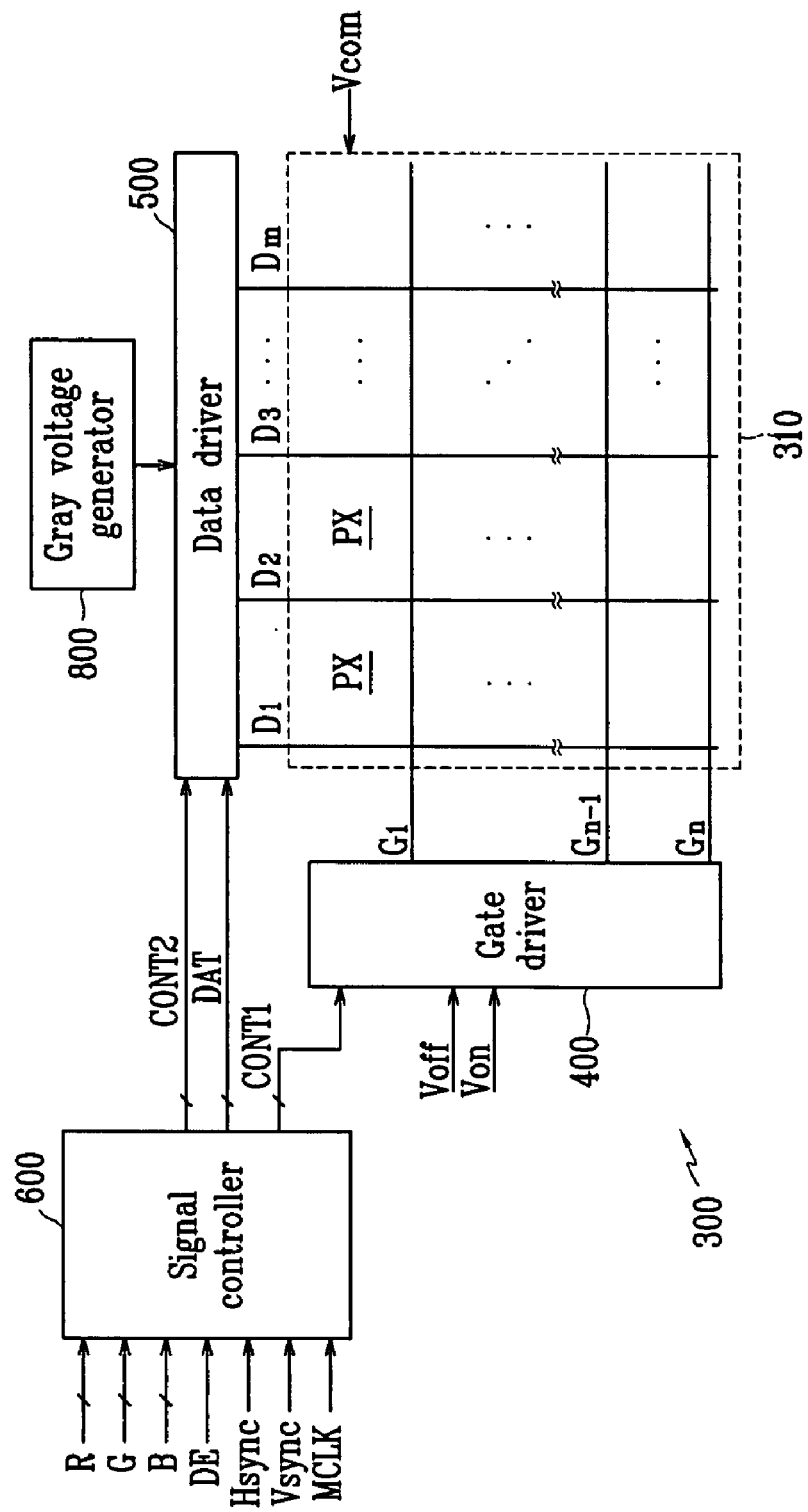
FIG. 3 is a block diagram of a display panel of the liquid crystal display according to the exemplary embodiment of the present invention.
Figure 4:
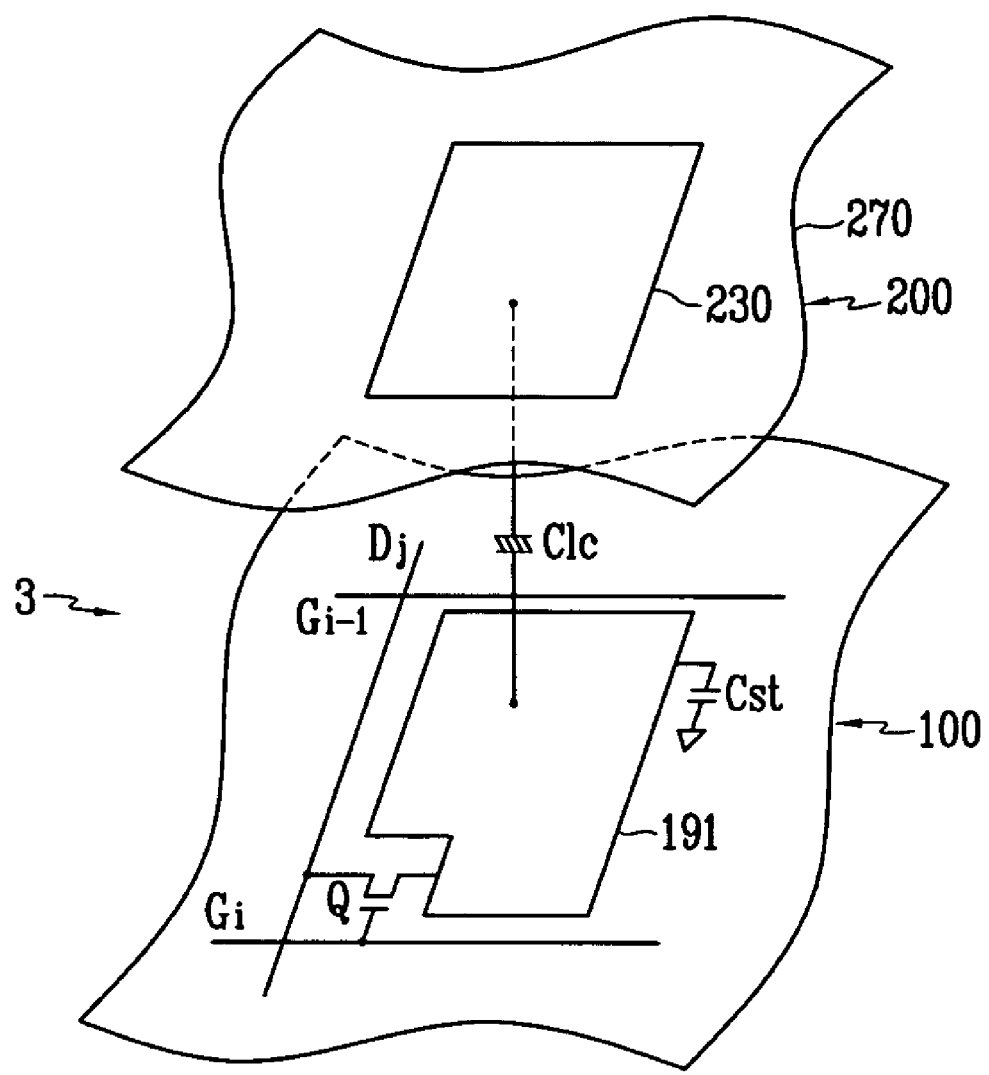
FIG. 4 is an equivalent circuit diagram of a pixel of the liquid crystal display according to the exemplary embodiment of the present invention.

FIG. 2 is a schematic view of a liquid crystal display according to an exemplary embodiment of the present invention, FIG. 3 is a block diagram showing functional blocks of a liquid crystal display according to an exemplary embodiment of the present invention, and FIG. 4 is an equivalent circuit diagram of one pixel of a liquid crystal display according to an exemplary embodiment of the present invention.

As shown in FIG. 2, the liquid crystal display according to the exemplary embodiment of the present invention includes a display panel 300, a flexible printed circuit film (FPC) 650 that is attached to the display panel 300, and a driving chip 700 that is mounted on the display panel 300.

The FPC 650 is attached to the vicinity of one base of the display panel 300, and has an opening 690 that, when the FPC 650 is folded, partially exposes the display panel 300. An input section 660 for inputting external signals from the outside is provided at the lower side of the opening 690. A plurality of signal lines (not shown) are provided for making electrical connections between the input section 660 and the driving chip 700. A plurality of display signal lines extend from the driving chip 700 across the display panel 300.

Pads (not shown), which are expanded areas on the signal lines, are provided where the signal lines are connected to the driving chip 700 and where the signal lines on the display panel 300 are attached to the signal lines on the flexible printed circuit film (FPC).

The display panel 300 includes a display area 310 for forming a screen and a peripheral area 320, and the peripheral area 320 may include a light blocking layer (not shown) (black matrix) for blocking light. The FPC 650 is attached to the peripheral area 320. The driving chip 700 is attached to the peripheral area 320.

As shown in FIG. 3, the display panel 300 includes a plurality of display signal lines including a plurality of gate lines $G_1$ to $G_n$, and a plurality of data lines $D_1$ to $D_m$, and a plurality of pixels PX that are connected to the plurality of display signal lines and are arranged in the form of a matrix. The pixels PX are in the display area 310 the boundary of which is shown by the dashed line. The display signal lines $G_1$ to $G_n$ and $D_1$ to $D_m$ cross the display area 310.

The display signal lines $G_1$ to $G_n$ and $D_1$ to $D_m$ include the plurality of gate lines $G_1$ to $G_n$ for transmitting gate signals (referred to as "scanning signals") and the plurality of data lines $D_1$ to $D_m$ for transmitting data signals. The gate lines $G_1$ to $G_n$ extend in a row direction and in parallel with one another. The data lines $D_1$ to $D_m$ extend in a column direction and in parallel with one another.

Turning now to FIG. 4, an upper panel 200 is provided that is smaller than a lower panel 100 so that a partial region of the lower panel 100 is exposed. The data lines $D_1$ to $D_m$ are extended through the exposed region and then connected with a data driver 500.

Each pixel PX, for example a pixel PX that is connected to the i-th (i=1, 2, n) gate line $G_i$ and the j-th (j=1, 2, m) data line $D_j$, includes a switching element Q that is connected to the signal lines $G_i$ and $D_j$ and a liquid crystal capacitor C1c and a storage capacitor Cst that are connected to the switching element Q. The storage capacitor Cst may be omitted as needed.

The switching element Q is a three terminal element such as a thin film transistor that is provided in the lower panel 100, and a control terminal thereof is connected to the gate line $G_i$, an input terminal thereof is connected to the data line $D_j$, and an output terminal thereof is connected to the liquid crystal capacitor C1c and the storage capacitor Cst.

The liquid crystal capacitor C1c has a pixel electrode 191 of the lower panel 100 and a common electrode 270 of the upper panel 200 as two terminals, and a liquid crystal layer 3 interposed between the two electrodes 191 and 270 functions as a dielectric material. The pixel electrode 191 is connected to the switching element Q and the common electrode 270 is formed on the entire surface of the upper panel 200 and receives a common voltage Vcom. In an alternative arrangement, unlike that shown in FIG. 3, the common electrode 270 may be provided in the lower panel 100, and in this case at least one of the two electrodes 191 and 270 may be formed in a line shape or a bar shape.

The storage capacitor Cst is in parallel with the liquid crystal capacitor C1c and is formed with the overlap of a separate signal line (not shown) and the pixel electrode 191 that is provided in the lower panel 100 with an insulator interposed therebetween, and a predetermined voltage such as a common voltage Vcom is applied to the separate signal line. However, the storage capacitor Cst may be formed by overlapping the pixel electrode 191 and a previous gate line with an insulator interposed therebetween.

Each of the pixels PX specifically displays one of three primary colors (spatial division) or each of the pixels PX alternately displays primary colors (temporal division) as time lapses, and a desired color is recognized by a spatial or temporal sum of the primary colors. The three primary colors exemplarily include red, green, and blue. FIG. 4 exemplarily shows spatial division. In FIG. 4, each pixel PX has a color filter 230 for one of the primary colors in a region of the upper panel 200 corresponding to the pixel electrode 191. In an alternative arrangement, unlike that shown in FIG. 4, the color filter 230 may be formed above or below the pixel electrode 191 on the lower panel 100.

At least one polarizer (not shown) for polarizing light is attached to an outer surface of the display panel 300.

Turning to FIG. 3, a gray voltage generator 800 generates two sets of gray voltages (or a set of reference gray voltages) related to transmittance of the pixel PX. One of the two sets has a positive value with respect to the common voltage Vcom and the other has a negative value.

A gate driver 400 is connected to the gate lines $G_1$ to $G_n$ of the display panel 300 and applies gate voltages, which are formed by a combination of a gate-on voltage Von and a gate-off voltage Voff, to the gate lines $G_1$ to $G_n$.

The data driver 500, connected to the data lines $D_1$ to $D_m$ of the display panel 300 through a transmission gate (not shown), selects a gray voltage from the gray voltage generator 800, and applies the selected gray voltage to the data lines $D_1$ to $D_m$ as a data signal.

A signal controller 600 controls the gate driver 400 and the data driver 500.

Turning to FIG. 2, the driving chip 700 receives external signals through signal lines (not shown) that are provided from the input section 660 on the FPC film 650, and supplies processed signals to the display panel 300 through wiring SL and $D_1$ provided at the peripheral area 320 of the display panel 300 so as to control the display panel 300. In this case, the signal line SL may be provided for transmitting the gate signals Von and Voff. In FIG. 2, the data line $D_1$ represents the data lines $D_1$ to $D_m$ and the signal line SL includes gate lines $G_1$ to $G_n$.

The driving chip 700 includes the gate driver 400, the data driver 500, the signal controller 600, and the gray voltage generator 800, which are shown in FIG. 3.

An operation of the liquid crystal display will be described in further detail.

The signal controller 600 receives input image signals R, G, and B and input control signals for displaying the input image signals from an external graphics controller (not shown). The input control signals include, for example, a vertical synchronization signal Vsync, a horizontal synchronizing signal Hsync, a main clock signal MCLK, and a data enable signal DE.

The signal controller 600 appropriately processes input image signals R, G, and B to correspond to an operating condition of the display panel 300 based on the input image signals R, G, and B and input control signals, generates a gate control signal CONT1 and a data control signal CONT2, and then transmits the gate control signal CONT1 to the gate driver 400 and transmits the data control signal CONT2 and the processed image signal DAT to the data driver 500.

The gate control signal CONT1 includes a scanning start signal STV that instructs scanning start and at least one clock signal that controls an output period of a gate-on voltage Von.

The data control signal CONT2 includes a horizontal synchronization start signal STH that informs of starting of transmission of the image data with respect to one row (set) of pixels PX, a load signal LOAD for indicating applying of a data signal to the data lines $D_1$ to $D_m$, and a data clock signal HCLK. The data control signal CONT2 may further include an inversion signal RVS for inverting voltage polarity of a data voltage with respect to the common voltage Vcom. Hereinafter, "voltage polarity of a data signal to a common voltage" will be referred to as "polarity of a data signal".

On the basis of the data control signal from the signal controller 600, the data driver 500 receives a digital image signal DAT for one row [set] of pixels PX, and selects the gray voltage corresponding to each digital image signal DAT. Then, the data driver 500 converts the digital image signal DAT into analog data signal, and applies the analog data signal to the corresponding data lines $D_1$ to $D_m$.

The gate driver 400 applies the gate-on voltage Von to the data lines $G_1$ to $G_n$ according to the gate control signal CON1 from the signal controller 600 so as to turn on the switching element Q connected to the gate lines $G_1$ to $G_n$. Accordingly, the data signal applied to the data lines $D_1$ to $D_m$ is applied to the corresponding pixel PX through the turned-on switching element Q.

A difference between the voltage of the data signal applied to the pixel PX and the common voltage Vcom becomes a charge voltage of the liquid crystal capacitor C1c, that is, it becomes a pixel voltage. The alignment of liquid crystal molecules varies depending on the magnitude of the pixel voltage, and thus the polarization of light that passes through the liquid crystal layer 3 is changed. The change in polarization causes a change in transmittance of light by the polarizers attached to the display panel 300.

By repeating this operation for every one horizontal period (referred to as "1H", which is equal to one cycle of the horizontal synchronizing signal Hsync and the data enable signal DE), the gate-on voltage Von is sequentially applied to all of the gate lines $G_1$ to $G_n$, and the data signal is applied to all of the pixels PX, so that an image corresponding to one frame is displayed.

When one frame is completed and a next frame starts, the state of the inversion signal RVS to be applied to the data driver 500 is controlled such that the polarity of the data voltage to be applied to each pixel is opposite to the polarity thereof in the previous frame ("frame inversion"). At this time, the polarity of the data signal on the data line may be changed in one frame according to the characteristics of the inversion signal, for example row inversion or dot inversion, or the polarity of the data signal applied to one pixel row may be different from each other, for example column inversion or dot inversion.

The liquid crystal display according to an exemplary embodiment of the present invention will be described in further detail with reference to FIG. 5 and FIG. 6.

Figure 5:
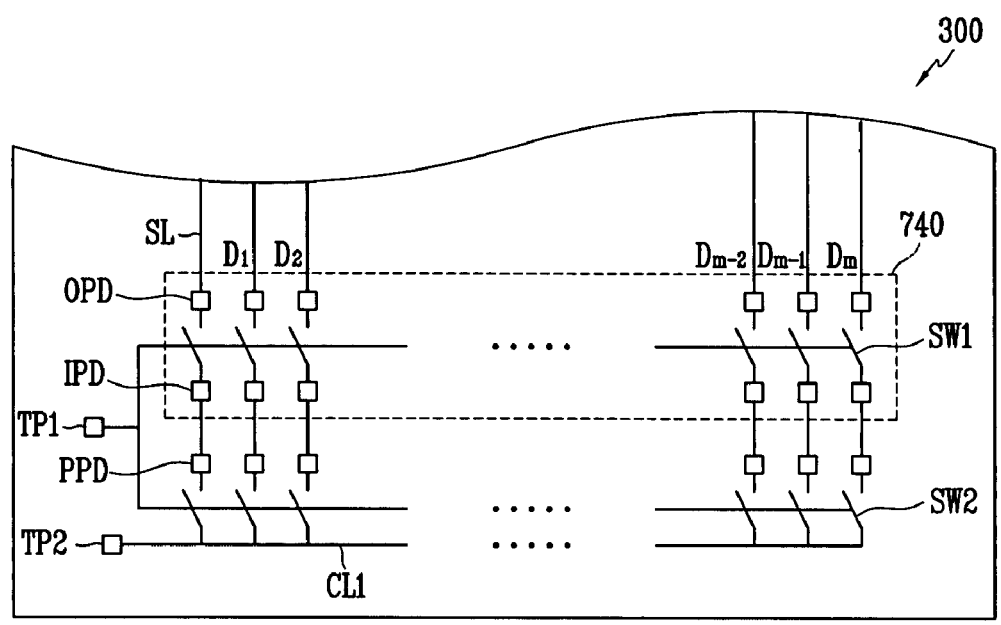
FIG. 5 is a schematic diagram showing a portion of the liquid crystal display of FIG. 2 enlarged.
Figure 5:
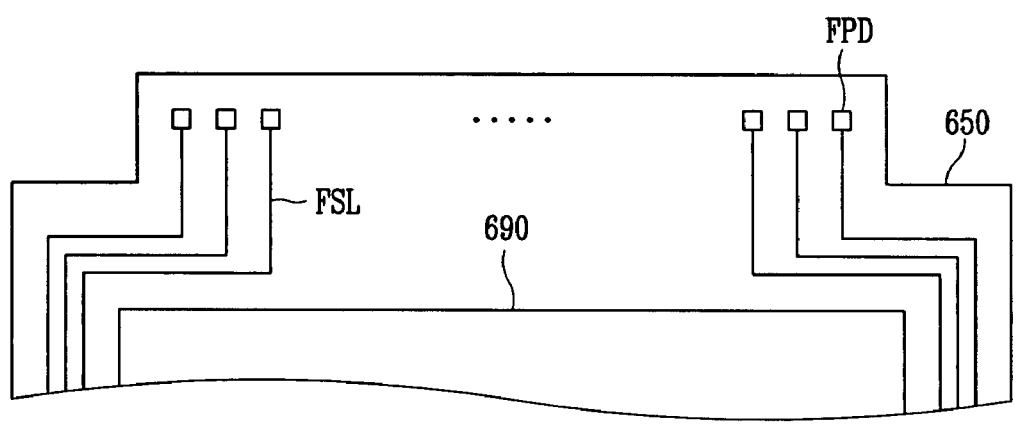
Figure 6:
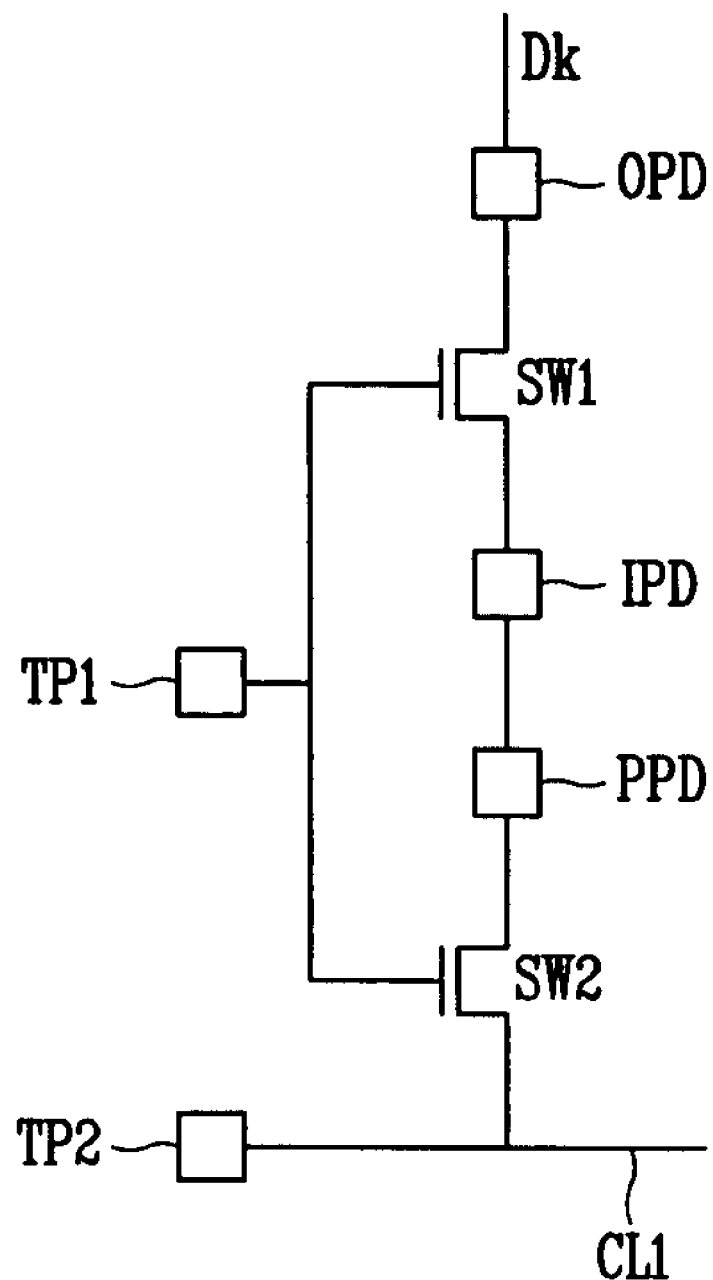
FIG. 6 is a layout diagram and circuit diagram of a portion of a display panel showing an arrangement of test pads for use in a visual inspection test.

FIG. 5 is a diagram showing schematically the layout of a portion, much enlarged, of the liquid crystal display of FIG. 2, and FIG. 6 is a circuit diagram of a portion of FIG. 5.

In further detail, the liquid crystal display of FIG. 2 is illustrated with separation of the display panel 300 and the FPC 650 in FIG. 5, and FIG. 6 shows the alignment of the pads shown in FIG. 5 in further detail.

As shown in FIG. 5 and FIG. 6, a plurality of pads OPD, IPD, PPD, TP1, and TP2 and switching elements SW1 and SW2 are disposed on the display panel 300.

Associated with each signal line, the input pad IPD and the output pad OPD are disposed on the driving chip area 740 where the driving chip 700 is mounted, and the first switching element SW1 is provided between the input pad IPD and the output pad OPD. The second switching element SW2 is provided between the display panel pad PPD and the connection line CL1.

The display signal lines including the gate lines $G_1$ to $G_n$ shown for convenience as signal line SL in FIG. 5, and the data lines $D_1$ to $D_m$, each include an output pad OPD that is connected to one of the first switching elements SW1. Control terminals of the first switching elements SW1 are connected to each other. In addition, control terminals of the second switching elements SW2 are connected to each other.

The control terminals of the first and second switching elements SW1 and SW2 are commonly connected to the test pad TP1, and input terminals of the respective second switching elements SW2 are commonly connected to the test pad TP2 through the connection line CL1.

Figure 7:
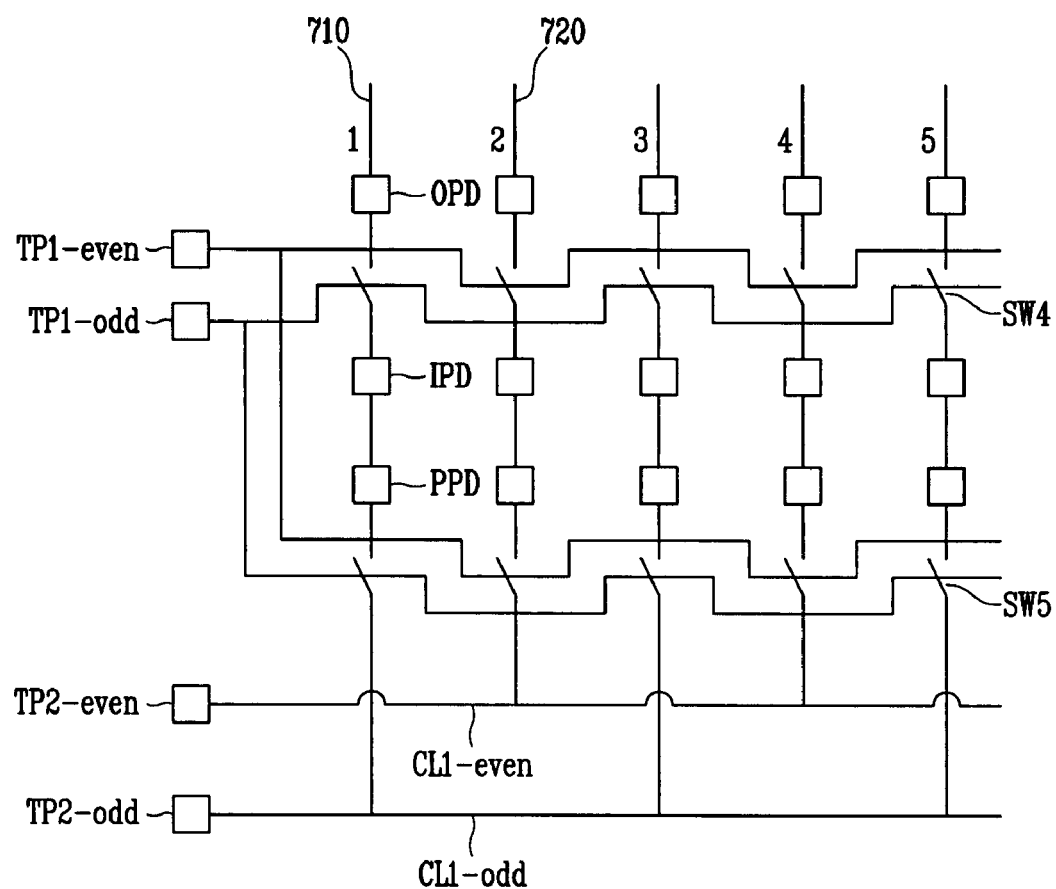
FIG. 7 is a schematic diagram showing an alternative embodiment of the present invention.

FIG. 7 is a schematic diagram showing an alternative embodiment of the invention in which the plurality of display signal lines is divided into two groups, a group of even numbered display signal lines and a group of odd numbered display signal lines. Test pad TP1-even is connected to the control terminals of first switching elements SW4 and second switching elements SW5 associated with even numbered signal lines 720. Test pad TP2-even is connected with the input terminals of second switching elements SW5 associated with even numbered display signal lines 720. Thus the even numbered display signal lines and the PPD pads and the IPD pads associated with the even numbered signal lines 720 are tested by applying an "on" voltage to test pad TP1-even and applying a test voltage to test pad TP2-odd Likewise test pad TP1-odd is connected with the control terminals of first switching elements SW4 and the control terminals of second switching elements SW5 that are associated with odd numbered display signal lines 710. Test pad TP2-odd is connected with the input terminals of second switching elements SW5 associated with odd numbered display signal lines 710. Thus the odd numbered display signal lines 710 are tested by applying an "on" voltage to test pad TP1-odd and applying a test voltage to test pad TP2-odd.

As previously described, signals lines FSL are disposed in the FPC 650 for delivering the external signals, and an FPC pad FPD is disposed at one end of each signal line FSL. The FPC pad FPD is attached to the display panel pad PPD so that a physical and electrical connection is established therebetween.

In a visual inspection test, a voltage is applied to the test pad TP1 so as to turn on the first and second switching elements SW1 and SW2, and then the test signal is applied through the test pad TP2. Accordingly, the test signal is applied through the display panel pad PPD, the input pad IPD, the output pad OPD, the gate lines $G_1$ to $G_n$, shown for convenience in FIG. 2 and FIG. 5 as the signal line SL, and the data lines $D_1$ to $D_m$ so that defects in the respective pads PPD, IPD, and OPD, the gate signal lines $G_1$ to $G_n$ shown for convenience a signal line SL in FIGS. 2 and 5, and the data lines $D_1$ to $D_m$ can be detected.

Figure 1:
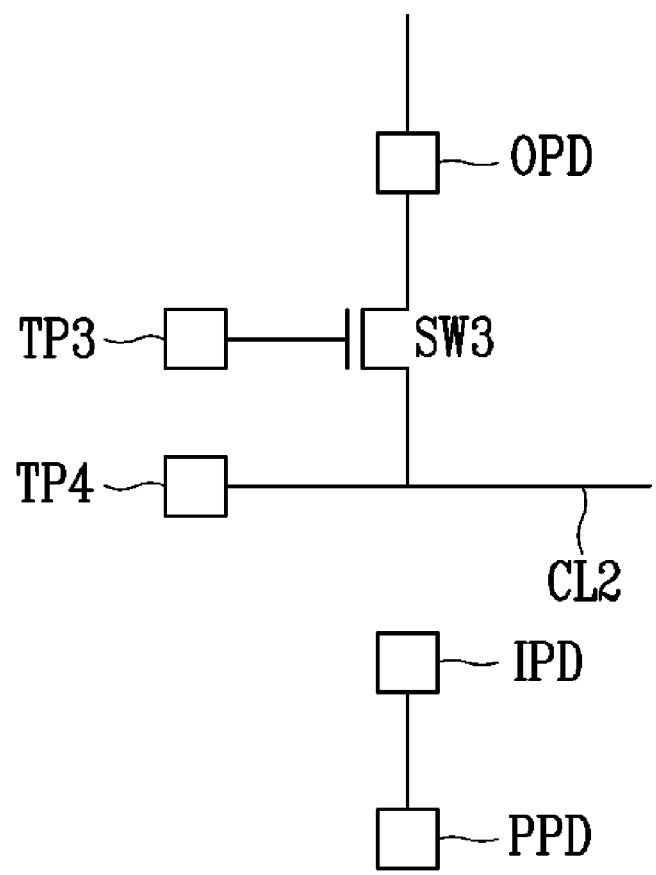
FIG. 1 is a schematic diagram of a portion of a display panel showing a conventional arrangement of test pads for use in a visual inspection test.

Therefore, a defective input pad IPD and a defective display panel pad PPD that cannot be detected in the conventional manner can be detected. FIG. 1 is a schematic diagram of a portion of a display panel showing a conventional arrangement of test pads for use in a visual inspection test. In this arrangement, only a single switching element SW3 is disposed between the output pad OPD and the input pad IPD to detect defects of the output pad OPD. Accordingly, a defective input pad IPD and a defective output pad OPD can be detected only after the driving chip 700 is mounted in a module test process rather than detected in a middle stage of the manufacturing process, thereby increasing manufacturing cost and time. However, the liquid crystal display device according to the exemplary embodiment of the present invention has one additional switching element SW2 to prevent the above-stated problem.

In addition, since the conventional display device has a connection line CL2 in the driving chip area 740, the size of the switching element SW3 becomes relatively small so that a charging rate is decreased, thereby reducing throughput at the visual inspection test. However, the connection line CL1 of the liquid crystal display device according to the exemplary embodiment of the present invention is disposed outside the driving chip area 740 so that the size of the switching element SW1 can be increased, thereby increasing the charging rate and increasing the throughput rate of the in-process visual inspection test.

In addition, a shorting bar (not shown) is located along an edge portion of the display panel 300 for preventing damage due to static electricity, and the connection line CL1 is located along the edge portion of the display panel 300 so that the damage due to the static electricity can be more efficiently prevented by connecting the shorting bar and the connection line CL1 or separating them from each other.

As previously described, processing time and production yield can be increased by improving the detection performance in the visual inspection test process.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
    a display panel;
    a driving chip mounted on the display panel; and
    a flexible printed circuit film attached to the display panel;
    wherein the display panel comprises:
    a plurality of display signal lines including gate lines and data lines;
    a plurality of first pads;
    a plurality of second pads;
    a plurality of third pads;
    a plurality of first switching elements disposed between the first pads and the second pads, each of the first switching elements comprising a control terminal, an input terminal, and an output terminals, the input terminal of the first switching elements being connected to the second pads and the output terminals of the first switching elements being connected to the first pads, and the second pads being directly connected to the third pads;

a plurality of second switching elements, each of the second switching elements comprising a control terminal, an input terminal and an output terminal, the output terminals of the second switching elements being directly connected to the third pads;

a first test pad connected to the control terminals of the first switching elements and to the control terminals of the second switching elements; and a second test pad connected to the input terminals of the second switching elements, wherein the first pads are located at ends of one of the display signal lines, and wherein the first pads, the first switching elements, the second pads, the third pads, and the second switching elements are connected in series and one to one correspondence.

2. The display device of claim 1, wherein the display panel comprises a display area, a peripheral area outside the display area, and a driving chip area within the peripheral area, the driving chip being mounted in the driving chip area.

3. The display device of claim 2, wherein the flexible printed circuit film includes a plurality of fourth pads that are attached to the plurality of third pads.

4. The display device of claim 2, wherein the first pads and the second pads are located in the driving chip area where the driving chip is mounted.

5. The display device of claim 1, wherein the input terminal of the second switching elements are connected to the second test pad through a connection line that connects the input terminals of each of the second switching elements to the second test pad.

6. The display device of claim 5, further comprising a gate driver for generating a gate signal and applying the gate signal to the gate lines, and a data driver for generating a data signal and applying the data signal to the data lines.

7. The display device of claim 6, wherein the driving chip comprises the gate driver and the data driver.

8. The display device of claim 1, wherein the display signal lines are numbered in a sequence of even numbers and odd numbers, wherein, for an odd numbered display signal line, an odd first test pad is connected to the control terminal of a first switching element and to the control terminal of a second switching element and an odd second test pad is connected to the input terminal of the second switching element; and for an even numbered display signal line, an even first test pad is connected to the control terminal of a first switching element and to the control terminal of a second switching element and an even second test pad is connected to the input terminal of the second switching element.

9. A display panel comprising:
a plurality of display signal lines including gate lines and data lines;
a plurality of first pads;
a plurality of second pads;
a plurality of third pads;
a plurality of first switching elements disposed between the first pads and the second pads, each of the first switching elements comprising a control terminal, an input terminal, and an output terminal, the input terminals of the first switching elements being connected to the second pads and the output terminals of the first switching elements being connected to the first pads, and the second pads being directly connected to the third pads;

a plurality of second switching elements, each of the second switching elements comprising a control terminal, an input terminal and an output terminal, the output terminals of the second switching elements being directly connected to the third pads;

a first test pad connected to the control terminals of the first switching elements and to the control terminals of the second switching elements; and a second test pad connected to the input terminals of the second switching elements, wherein the first pads are located at ends of the display signal lines, and wherein the first pads, the first switching elements, the second pads, the third pads, and the second switching elements are connected in series and one to one correspondence.

10. The display panel of claim 9 comprising a display area, a peripheral area outside the display area, and a driving chip area within the peripheral area, a driving chip being mounted in the driving chip area.

11. The display panel of claim 10, wherein a flexible printed circuit film is attached to the display panel, and the flexible printed circuit film includes a plurality of fourth pads that are attached to the plurality of third pads.

12. The display panel of claim 10, wherein the first pads and the second pads are located in the driving chip area where the driving chip is mounted.

13. The display panel of claim 9, wherein the input terminals of the second switching elements are connected to the second test pad through a connection line that connects the input terminals of the second switching elements to the second test pad.

14. The display panel of claim 13, further comprising a gate driver for generating a gate signal and applying the gate signal to the gate lines, and a data driver for generating a data signal and applying the data signal to the data lines.

15. The display panel of claim 14, wherein the driving chip comprises the gate driver and the data driver.

16. The display panel of claim 9, wherein the first switching elements comprise third and fourth switching elements and the second switching elements comprise fifth and sixth switching elements, and the third and fifth switching elements are connected to odd-numbered pads among the first and third pads and the fourth and sixth switching elements are connected to even-numbered pads among the first and third pads.

17. The display panel of claim 16, wherein the first test pad comprises third and fourth test pads, control terminals of the third and fifth switching elements are connected to the third test pad, and control terminals of the fourth and sixth switching elements are connected to the fourth test pad.

18. The display panel of claim 17, wherein the second test pad comprises fifth and sixth test pads, input terminals of the fifth switching elements are connected to the fifth test pad, and input terminals of the sixth switching elements are connected to the sixth test pad.

19. The display panel of claim 9, wherein the display signal lines are numbered in a sequence of even numbers and odd numbers, and the first test pads and the second test pads comprise odd numbered test pads and even numbered test pads, respectively.

20. The display panel of claim 19, wherein, for the odd numbered display signal line, the odd first test pad is connected to the control terminal of the first switching element and to the control terminal of the second switching element and the odd second test pad is connected to the input terminal of the second switching element; and for the even numbered display signal line, the even first test pad is connected to the control terminal of the first switching element and to the control terminal of the second switching element and the even second test pad is connected to the input terminal of the second switching element.

* * * * *